United States Patent
Choi et al.

(10) Patent No.: US 9,761,328 B2
(45) Date of Patent: Sep. 12, 2017

(54) TEST MODE CIRCUIT WITH SERIALIZED I/O AND SEMICONDUCTOR MEMORY DEVICE INCLUDING THE SAME

(71) Applicant: SK hynix Inc., Icheon-si, Gyeonggi-do (KR)

(72) Inventors: Geun Ho Choi, Icheon-si (KR); Yong Suk Joo, Yongin-si (KR)

(73) Assignee: SK hynix Inc., Incheon-si, Gyeonggi-do (KR)

( * ) Notice: Subject to any disclaimer, the term of this patent is extended or adjusted under 35 U.S.C. 154(b) by 0 days.

(21) Appl. No.: 14/878,905

(22) Filed: Oct. 8, 2015

(65) Prior Publication Data

US 2016/0351237 A1 Dec. 1, 2016

(30) Foreign Application Priority Data

May 27, 2015 (KR) .......................... 10-2015-0074309

(51) Int. Cl.
- *G11C 29/12* (2006.01)
- *G11C 29/18* (2006.01)
- *G11C 29/32* (2006.01)
- *G11C 29/36* (2006.01)

(52) U.S. Cl.
CPC .... *G11C 29/12015* (2013.01); *G11C 29/1201* (2013.01); *G11C 29/18* (2013.01); *G11C 29/32* (2013.01); *G11C 29/36* (2013.01)

(58) Field of Classification Search
CPC .......... G11C 29/12015; G11C 29/1201; G11C 29/18; G11C 29/36; G11C 29/32
See application file for complete search history.

(56) References Cited

U.S. PATENT DOCUMENTS

| | | | | |
|---|---|---|---|---|
| 5,805,609 A | * | 9/1998 | Mote, Jr. | ........ G01R 31/318558 714/30 |
| 6,272,588 B1 | * | 8/2001 | Johnston | .............. G11C 29/028 365/201 |
| 6,493,839 B1 | * | 12/2002 | Miner | .................... G11C 29/12 714/31 |
| 6,996,754 B1 | * | 2/2006 | Lee | ........................ G11C 29/48 714/723 |
| 2012/0133252 A1 | | 5/2012 | Chung | |

FOREIGN PATENT DOCUMENTS

KR      1020120070405 A    6/2012

* cited by examiner

*Primary Examiner* — J. H. Hur
*Assistant Examiner* — Ajay Ojha
(74) *Attorney, Agent, or Firm* — William Park & Associates Ltd.

(57) ABSTRACT

A semiconductor system may include a controller and a semiconductor device. The controller may output command/address signals. The semiconductor device may generate a plurality of control codes from the command/address signals in a test mode according to a combination of the command/address signals. The semiconductor device may output a first output datum generated by serializing the plurality of control codes, and the first output datum, through a single pad.

11 Claims, 7 Drawing Sheets

TEST MODE CIRCUIT WITH SERIALIZED I/O AND SEMICONDUCTOR MEMORY DEVICE INCLUDING THE SAME

CROSS-REFERENCE TO RELATED APPLICATIONS

The present application claims priority under 35 U.S.C 119(a) to Korean Application No. 10-2015-0074309, filed on May 27, 2015, in the Korean Intellectual Property Office, which is incorporated herein by reference in its entirety as set forth in full.

BACKGROUND

1. Technical Field

Embodiments of the present disclosure generally relate to a semiconductor device and a semiconductor system.

2. Related Art

A semiconductor device may simultaneously receive commands and addresses through a plurality of pins. At this time, signals that are input through the plurality of pins may include information on all of the commands and the addresses. A command decoder and an address decoder may be used to decode the signals that are input through the plurality of pins and may be used to extract the commands and the addresses.

In addition, the semiconductor device may generate a plurality of internal clock signals with multiple phases for a high-speed operation and may receive and output data using the internal clock signals. For example, the semiconductor device may generate four internal clock signals having a phase difference of approximately 90 degrees, and the internal clock signals may be used to receive and output the data. In such a case, the semiconductor device may operate at a high speed as compared with a case where the data is input or output in response to a strobe signal.

Attempts to reduce test costs by reducing a test time of a semiconductor device have been widely made. Particularly, in order to test more semiconductor devices at a time with test equipment having limited channels, it may be necessary to adjust the number of input/output (I/O) channels of the test equipment.

SUMMARY

According to an embodiment, a semiconductor system may be provided. The semiconductor system may include a controller and a semiconductor device. The controller may be suitable for outputting command/address signals. The semiconductor device may be suitable for generating a plurality of control codes from the command/address signals in a test mode according to a combination of the command/address signals. The semiconductor device may be suitable for outputting a first output datum generated by serializing the plurality of control codes through a single pad.

According to an embodiment, a semiconductor device may be provided. The semiconductor device may include a path control unit, a first selection transfer unit, a path conversion unit, a second selection transfer unit, and a pad section. The path control unit may be suitable for generating a test mode signal enabled if a combination of command/address signals is a first combination, suitable for storing a plurality of control codes within the path control unit, and suitable for outputting the plurality of control codes as a plurality of internal control codes. The first selection transfer unit may be suitable for outputting the plurality of internal control codes as a plurality of high-order parallel control codes if the test mode signal is enabled and suitable for outputting the plurality of internal control codes as a plurality of low-order parallel control codes if the test mode signal is disabled. The path conversion unit may be suitable for generating a serial control code by serializing the plurality of high-order parallel control codes while the semiconductor device is in a test mode and suitable for outputting a plurality of global data as a plurality of internal data while the semiconductor device is in a normal mode. The second selection transfer unit may be suitable for outputting the serial control code as first internal data if the test mode signal is enabled and suitable for outputting the plurality of low-order parallel control codes as the plurality of internal data if the test mode signal is disabled. The pad section may include a plurality of pads. The pad section may be suitable to output through the plurality of pads the plurality of internal data as a plurality of output data.

According to an embodiment, a semiconductor device may be provided. The semiconductor device may include a first selection transfer unit, a path conversion unit, a second selection transfer unit, and a pad section. The first selection transfer unit may be suitable for outputting a plurality of internal control codes as a plurality of high-order parallel control codes if a test mode signal is enabled and suitable for outputting the plurality of internal control codes as a plurality of low-order parallel control codes if the test mode signal is disabled. The path conversion unit may be suitable for generating a serial control code by serializing the plurality of high-order parallel control codes while the semiconductor device is in a test mode and suitable for outputting a plurality of global data as a plurality of internal data while the semiconductor device is in a normal mode. The second selection transfer unit may be suitable for outputting the serial control code as first internal data if the test mode signal is enabled and suitable for outputting the plurality of low-order parallel control codes as the plurality of internal data if the test mode signal is disabled. The pad section may include a plurality of pads. The pad section may be suitable to output through the plurality of pads the plurality of internal data as a plurality of output data.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to a semiconductor device and a semiconductor system configured to serialize a plurality of control codes generated in parallel to include internal information of the semiconductor device and output the serialized control codes through a single pad, in a test mode.

Figure 1:
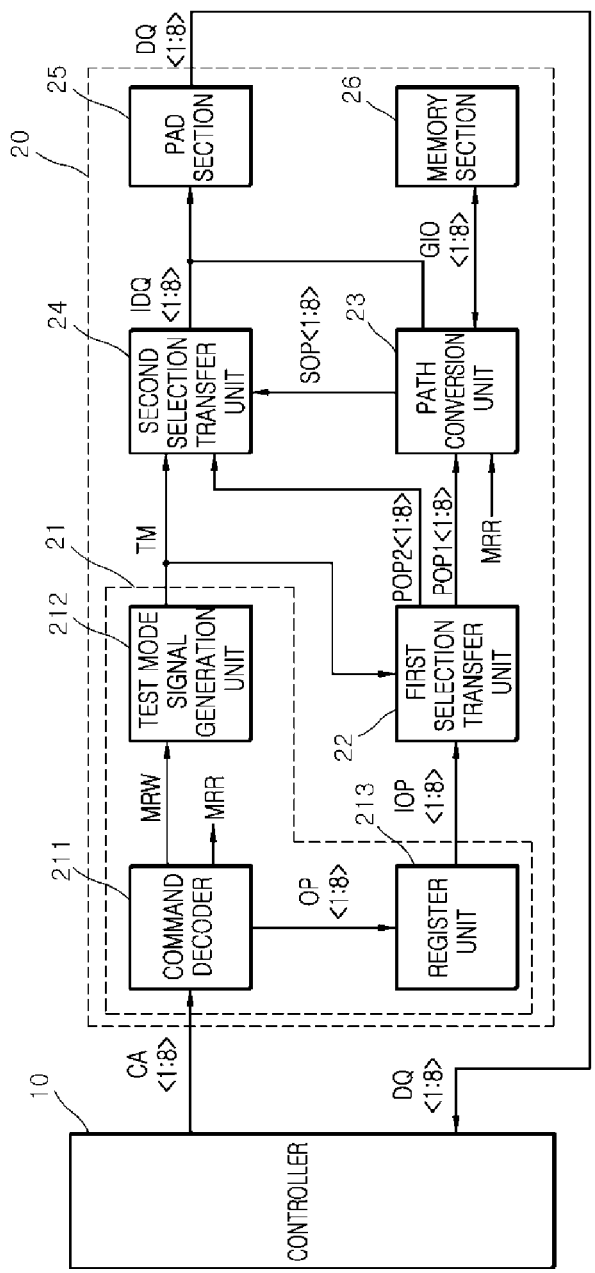
FIG. 1 is a block diagram illustrating a representation of an example a configuration of a semiconductor system according to an embodiment.

Referring to FIG. 1, a semiconductor system according to an example of an embodiment may include a controller 10 and a semiconductor device 20. The semiconductor device 20 may include a path control unit 21, a first selection transfer unit 22, a path conversion unit 23, a second selection transfer unit 24, a pad section 25, and a memory section 26.

The controller 10 may output first to eighth command/ address signals CA<1:8> and may receive first to eighth output data DQ<1:8> including internal information of the semiconductor system 20. The controller 10 may be configured to control an operation of the semiconductor system 20 or may be realized using test equipment capable of testing the semiconductor system 20, according to the various embodiments.

The path control unit 21 may include a command decoder 211, a test mode signal generation unit 212, and a register unit 213.

The command decoder 211 may generate a first command MRW enabled (i.e., at a predetermined level) if a combination of the first to eighth command/address signals CA<1:8> is a first combination and may generate first to eighth control codes OP<1:8> from the first to eighth command/address signals CA<1:8>. The command decoder 211 may generate a second command MRR enabled if a combination of the first to eighth command/address signals CA<1:8> is a second combination. For example, if the first to eighth command/address signals CA<1:8> have the first combination, the semiconductor device 20 may be set to enter a test mode. The first to eighth control codes OP<1:8> may be set as a parallel signal having eight bits.

The test mode signal generation unit 212 may generate a test mode signal TM. The test mode signal TM may be enabled in response to the first command MRW.

The register unit 213 may store the first to eighth control codes OP<1:8> therein, and may output the first to eighth control codes OP<1:8> as first to eighth internal control codes IOP<1:8>. The first to eighth internal control codes IOP<1:8> may be set as a parallel signal having eight bits.

For example, the path control unit 21 may generate the test mode signal TM if the combination of the first to eighth command/address signals CA<1:8> is the first combination, may store the first to eighth control codes OP<1:8> generated from the first to eighth command/address signals CA<1: 8>, and may output the first to eighth control codes OP<1:8> as the first to eighth internal control codes IOP<1:8>.

The first selection transfer unit 22 may output the first to eighth internal control codes IOP<1:8> as first to eighth high-order parallel control codes POP1<1:8> or as low-order parallel control codes POP2<1:8>, in response to the test mode signal TM. For example, the first to eighth high-order parallel control codes POP1<1:8> may be set as a parallel signal having eight bits, and the first to eighth low-order parallel control codes POP2<1:8> may be set as a parallel signal having eight bits.

The path conversion unit 23 may generate first to eighth serial control codes SOP<1:8> by serializing the first to eighth high-order parallel control codes POP1<1:8> in response to the second command MRR. The path conversion unit 23 may output first to eighth global data GIO<1:8> as first to eighth internal data IDQ<1:8> if the semiconductor device 20 is out of the test mode or not operating in the test mode. The first to eighth serial control codes SOP<1:8> may be set as a serial signal whose bits are sequentially generated. For example, the first to eighth global data GIO<1:8> may be set as a parallel signal having eight bits, and the first to eighth internal data IDQ<1:8> may be set as a parallel signal having eight bits.

The second selection transfer unit 24 may output the first to eighth serial control codes SOP<1:8> as any one of the first to eighth internal data IDQ<1:8> or may output the low-order parallel control codes POP2<1:8> as the first to eighth internal data IDQ<1:8>, in response to the test mode signal TM.

The pad section 25 may include a plurality of pads and may receive the first to eighth internal data IDQ<1:8> to output the first to eighth internal data IDQ<1:8> as first to eighth output data DQ<1:8>. The first to eighth output data DQ<1:8> may be set as a parallel signal having eight bits.

The memory section 26 may include a plurality of memory cells and may receive or output the first to eighth global data GIO<1:8> during a normal operation.

Figure 2:
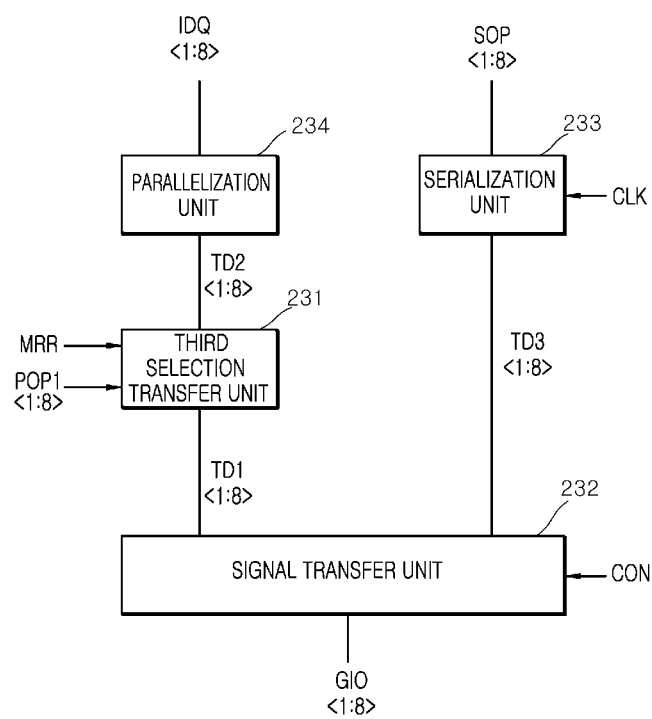
FIG. 2 is a block diagram illustrating a representation of an example a configuration of a path conversion unit included in the semiconductor system of FIG. 1.

Referring to FIG. 2, the path conversion unit 23 may include a third selection transfer unit 231, a signal transfer unit 232, a serialization unit 233, and a parallelization unit 234.

The third selection transfer unit 231 may output the first to eighth high-order parallel control codes POP1<1:8> as first to eighth high-order transfer data TD1<1:8> or may output the first to eighth high-order transfer data TD1<1:8> as first to eighth mid-order transfer data TD2<1:8>, in response to the second command MRR. The first to eighth high-order transfer data TD1<1:8> may be set as a parallel signal having eight bits, and the first to eighth mid-order transfer data TD2<1:8> may be set as a parallel signal having eight bits.

The signal transfer unit 232 may output the first to eighth high-order transfer data TD1<1:8> as first to eighth low-order transfer data TD3<1:8> or may output the first to eighth global data GIO<1:8> as the first to eighth high-order transfer data TD1<1:8>, in response to a control signal CON enabled during the normal operation. The first to eighth low-order transfer data TD3<1:8> may be set as a parallel signal having eight bits.

The serialization unit 233 may generate the first to eighth serial control codes SOP<1:8> by serializing the first to eighth low-order transfer data TD3<1:8> in synchronization with a clock signal CLK. The path conversion unit 23 may output first to eighth global data GIO<1:8> as first to eighth internal data IDQ<1:8> from the parallelization unit 234 if the semiconductor device 20 is out of the test mode, not operating in the test mode, or operating in a normal mode. The parallelization unit 234 may be configured to output the plurality of mid-order transfer data TD2<1:8> as the plurality of internal data IDQ<1:8>.

Figure 3:
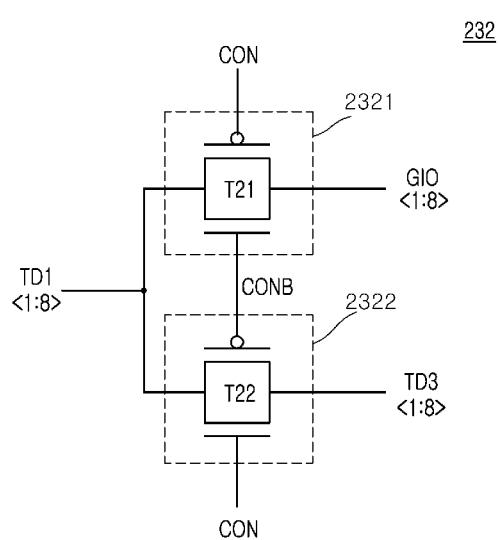
FIG. 3 is a circuit diagram illustrating a representation of an example a configuration of a signal transfer unit included in the path conversion unit of FIG. 2.

Referring to FIG. 3, the signal transfer unit 232 may include a first transfer unit 2321 and a second transfer unit 2322.

The first transfer unit 2321 may be realized using a transfer gate T21 that is turned on in response to the control signal CON which is enabled to a logic low level during the normal operation and may output the first to eighth global data GIO<1:8> as the first to eighth high-order transfer data TD1<1:8>. The first transfer unit 2321 may be realized to have a configuration that input and output lines through which the first to eighth global data GIO<1:8> are transmitted are coupled to input and output lines through which the first to eighth high-order transfer data TD1<1:8> are transmitted, according to the various embodiments.

The second transfer unit 2322 may be realized using a transfer gate T22 that is turned on in response to the control signal CON which is disabled to a logic high level during the test mode and may output the first to eighth high-order transfer data TD1<1:8> as the first to eighth low-order transfer data TD3<1:8>. The second transfer unit 2322 may be realized to have a configuration that input and output lines through which the first to eighth high-order transfer data TD1<1:8> are transmitted are coupled to input and output lines through which the first to eighth low-order transfer data TD3<1:8> are transmitted, according to the various embodiments. The transfer gates T21 and T22 may also receive an inverted control signal CONB.

Figure 4:
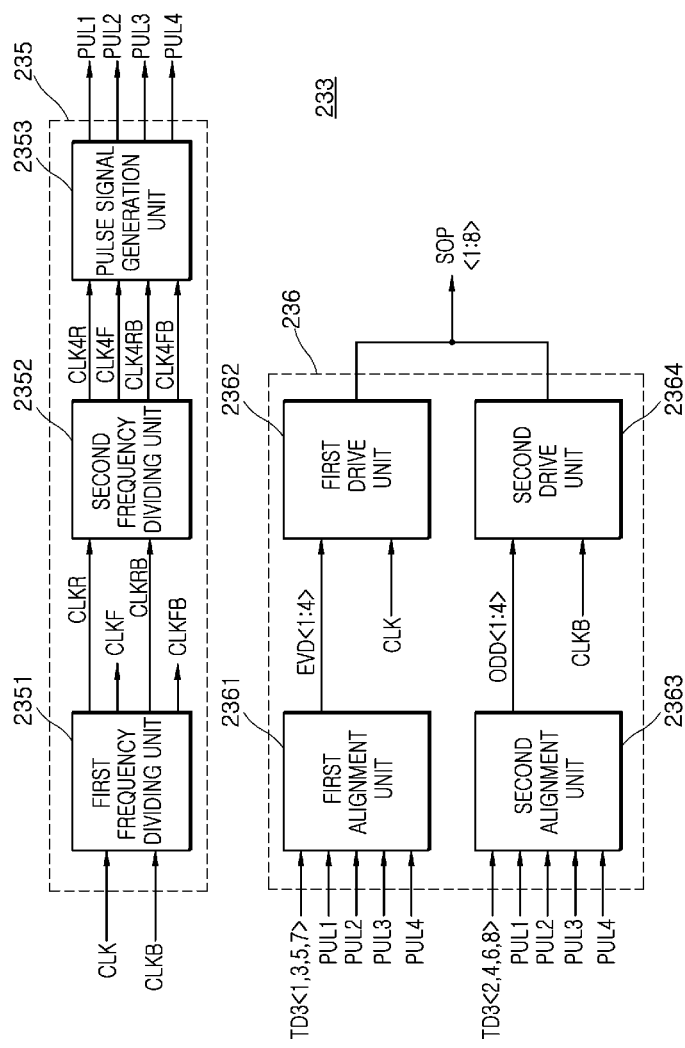
FIG. 4 is a block diagram illustrating a representation of an example a configuration of a serialization unit included in the path conversion unit of FIG. 2.

Referring to FIG. 4, the serialization unit 233 may include a clock dividing unit 235 and a serial control code generation unit 236.

The clock dividing unit 235 may include a first frequency dividing unit 2351, a second frequency dividing unit 2352, and a pulse signal generation unit 2353.

The first frequency dividing unit 2351 may generate a rising clock signal CLKR having a frequency which is half a frequency of the clock signal CLK in synchronization with a rising edge of the clock signal CLK and a falling clock signal CLKF having a frequency which is half a frequency of an inverted clock signal CLKB in synchronization with a rising edge of the inverted clock signal CLKB. The first frequency dividing unit 2351 may generate an inverted rising clock signal CLKRB obtained by inverting the rising clock signal CLKR, and an inverted falling clock signal CLKFB obtained by inverting the falling clock signal CLKF. The inverted clock signal CLKB may be obtained by inverting the clock signal CLK.

The second frequency dividing unit 2352 may generate a first dividing clock signal CLK4R having a frequency which is half the frequency of the rising clock signal CLKR in synchronization with a rising edge of the rising clock signal CLKR, and a second dividing clock signal CLK4F having a frequency which is half the frequency of the inverted rising clock signal CLKRB in synchronization with a rising edge of the inverted rising clock signal CLKRB. The second frequency dividing unit 2352 may generate a third dividing clock signal CLK4RB obtained by inverting the first dividing clock signal CLK4R, and a fourth dividing clock signal CLK4RF obtained by inverting the second dividing clock signal CLK4F.

The pulse signal generation unit 2353 may generate a first pulse signal PUL1 including pulses which are generated during a predetermined period in synchronization with a rising edge of the first dividing clock signal CLK4R, and a second pulse signal PUL2 including pulses which are generated during a predetermined period in synchronization with a rising edge of the second dividing clock signal CLK4F. The pulse signal generation unit 2353 may generate a third pulse signal PUL3 including pulses which are generated during a predetermined period in synchronization with a rising edge of the third dividing clock signal CLK4RB, and a fourth pulse signal PUL4 including pulses which are generated during a predetermined period in synchronization with a rising edge of the fourth dividing clock signal CLK4FB.

For example, the clock dividing unit 235 may generate the first to fourth pulse signals PUL1, PUL2, PUL3, and PUL4 including pulses that are sequentially generated by dividing frequencies of the clock signal CLK and the inverted clock signal CLKB.

Figure 5:
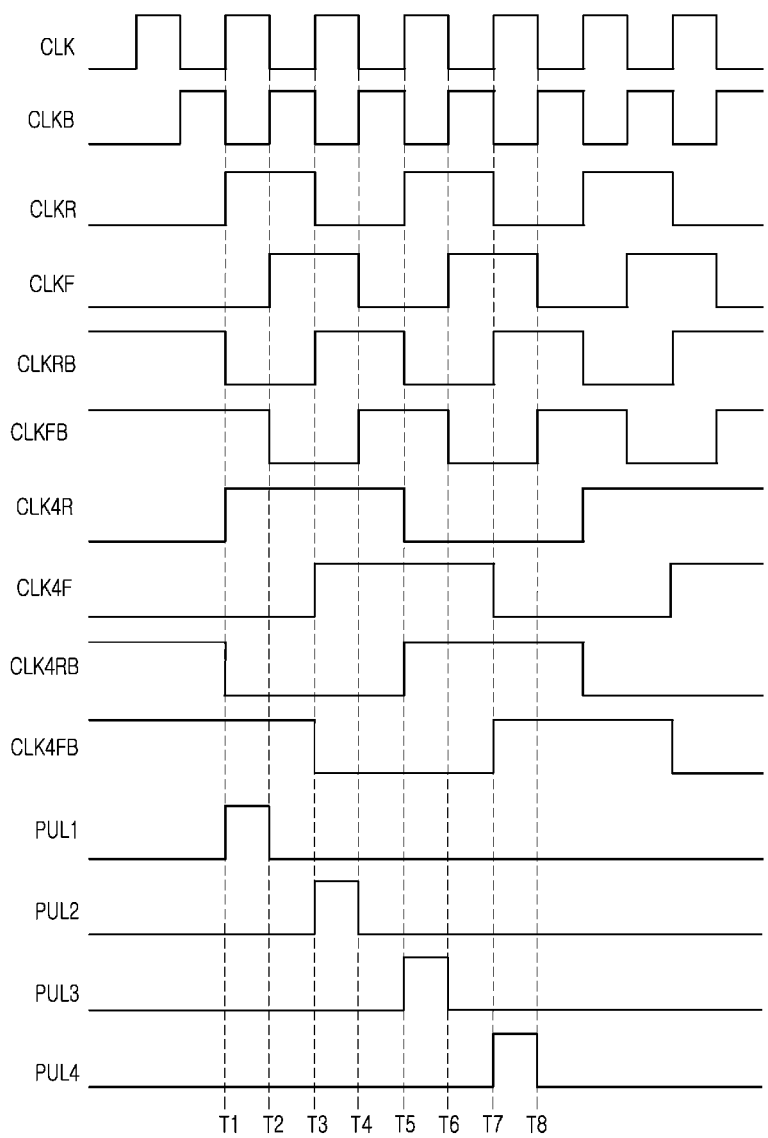
FIG. 5 is a timing diagram illustrating a representation of an example an operation of a clock dividing unit included in the serialization unit of FIG. 4.

An operation of the clock dividing unit 235 will be described hereinafter with reference to FIG. 5 in conjunction with an example in which the first to fourth pulse signals PUL1, PUL2, PUL3, and PUL4 including pulses that are sequentially created are generated by dividing frequencies of the clock signal CLK and the inverted clock signal CLKB.

At a point of time "T1", the first frequency dividing unit 2351 may generate the rising clock signal CLKR having a frequency which is half the frequency of the clock signal CLK in synchronization with the rising edge of the clock signal CLK.

The second frequency dividing unit 2352 may generate the first dividing clock signal CLK4R having a frequency which is half the frequency of the rising clock signal CLKR in synchronization with the rising edge of the rising clock signal CLKR.

The pulse signal generation unit 2353 may generate the first pulse signal PUL1 including pulses that are generated during a predetermined period in synchronization with the rising edge of the first dividing clock signal CLK4R.

At a point of time "T2", the first frequency dividing unit 2351 may generate the falling clock signal CLKF having a frequency which is half the frequency of the inverted clock signal CLKB in synchronization with the rising edge of the inverted clock signal CLKB.

At a point of time "T3", the first frequency dividing unit 2351 may generate the inverted rising clock signal CLKRB that is obtained by inverting the rising clock signal CLKR.

The second frequency dividing unit 2352 may generate the second dividing clock signal CLK4F having a frequency which is half the frequency of the inverted rising clock signal CLKRB in synchronization with the rising edge of the inverted rising clock signal CLKRB.

The pulse signal generation unit 2353 may generate the second pulse signal PUL2 including pulses that are generated during a predetermined period in synchronization with the rising edge of the second dividing clock signal CLK4F.

At a point of time "T4", the first frequency dividing unit 2351 may generate the inverted falling clock signal CLKFB obtained by inverting the falling clock signal CLKF.

At a point of time "T5", the first frequency dividing unit 2351 may generate the rising clock signal CLKR having a frequency which is half the frequency of the clock signal CLK in synchronization with the rising edge of the clock signal CLK.

The second frequency dividing unit 2352 may generate the third dividing clock signal CLK4RB obtained by inverting the first dividing clock signal CLK4R.

The pulse signal generation unit 2353 may generate the third pulse signal PUL3 including pulses generated during a predetermined period in synchronization with the rising edge of the third dividing clock signal CLK4RB.

At a point of time "T6", the first frequency dividing unit 2351 may generate the falling clock signal CLKF having a frequency which is half the frequency of the inverted clock signal CLKB in synchronization with the rising edge of the inverted clock signal CLKB.

At a point of time "T7", the first frequency dividing unit 2351 may generate the inverted rising clock signal CLKRB obtained by inverting the rising clock signal CLKR.

The second frequency dividing unit 2352 may generate the fourth dividing clock signal CLK4FB obtained by inverting the second dividing clock signal CLK4F.

The pulse signal generation unit 2353 may generate the fourth pulse signal PUL4 including pulses generated during a predetermined period in synchronization with the rising edge of the fourth dividing clock signal CLK4FB.

At a point of time "T8", the first frequency dividing unit 2351 may generate the inverted falling clock signal CLKFB that is obtained by inverting the falling clock signal CLKF.

As described above, the clock dividing unit 235 (see FIG. 4) may generate the first to fourth pulse signals PUL1, PUL2, PUL3, and PUL4 including pulses that are sequentially generated by dividing frequencies of the clock signal CLK and the inverted clock signal CLKB.

The serial control code generation unit 236 may include a first alignment unit 2361, a first drive unit 2362, a second alignment unit 2363, and a second drive unit 2364.

The first alignment unit 2361 may latch the first low-order transfer data TD3<1> in synchronization with a pulse of the first pulse signal PUL1 to generate a first even data EVD<1>. The first alignment unit 2361 may latch the third low-order transfer data TD3<3> in synchronization with a pulse of the second pulse signal PUL2 to generate a second even data EVD<2>. The first alignment unit 2361 may latch the fifth low-order transfer data TD3<5> in synchronization with a pulse of the third pulse signal PUL3 to generate a third even data EVD<3>. The first alignment unit 2361 may latch the seventh low-order transfer data TD3<7> in synchronization with a pulse of the fourth pulse signal PUL4 to generate a fourth even data EVD<4>.

The first drive unit 2362 may generate the first serial control code SOP<1> by buffering the first even data EVD<1> in synchronization with the rising edge of the clock signal CLK. The first drive unit 2362 may generate the third serial control code SOP<3> by buffering the second even data EVD<2> in synchronization with the rising edge of the clock signal CLK. The first drive unit 2362 may generate the fifth serial control code SOP<5> by buffering the third even data EVD<3> in synchronization with the rising edge of the clock signal CLK. The first drive unit 2362 may generate the seventh serial control code SOP<7> by buffering the fourth even data EVD<4> in synchronization with the rising edge of the clock signal CLK.

The second alignment unit 2363 may generate a first odd data ODD<1> by latching the second low-order transfer data TD3<2> in synchronization with the pulse of the first pulse signal PUL1. The second alignment unit 2363 may generate a second odd data ODD<2> by latching the fourth low-order transfer data TD3<4> in synchronization with the pulse of the second pulse signal PUL2. The second alignment unit 2363 may generate a third odd data ODD<3> by latching the sixth low-order transfer data TD3<6> in synchronization with the pulse of the third pulse signal PUL3. The second alignment unit 2363 may generate a fourth odd data ODD<4> by latching the eighth low-order transfer data TD3<8> in synchronization with the pulse of the fourth pulse signal PUL4.

The second drive unit 2364 may generate the second serial control code SOP<2> by buffering the first odd data ODD<1> in synchronization with the rising edge of the inverted clock signal CLKB. The second drive unit 2364 may generate the fourth serial control code SOP<4> by buffering the second odd data ODD<2> in synchronization with the rising edge of the inverted clock signal CLKB. The second drive unit 2364 may generate the sixth serial control code SOP<6> by buffering the third odd data ODD<3> in synchronization with the rising edge of the inverted clock signal CLKB. The second drive unit 2364 may generate the eighth serial control code SOP<8> by buffering the fourth odd data ODD<4> in synchronization with the rising edge of the inverted clock signal CLKB.

For example, the serial control code generation unit 236 may generate the first to eighth serial control codes SOP<1:8> by serializing the first to eighth low-order transfer data TD3<1:8> in synchronization with the first to fourth pulse signals PUL1, PUL2, PUL3, and PUL4.

Figure 6:
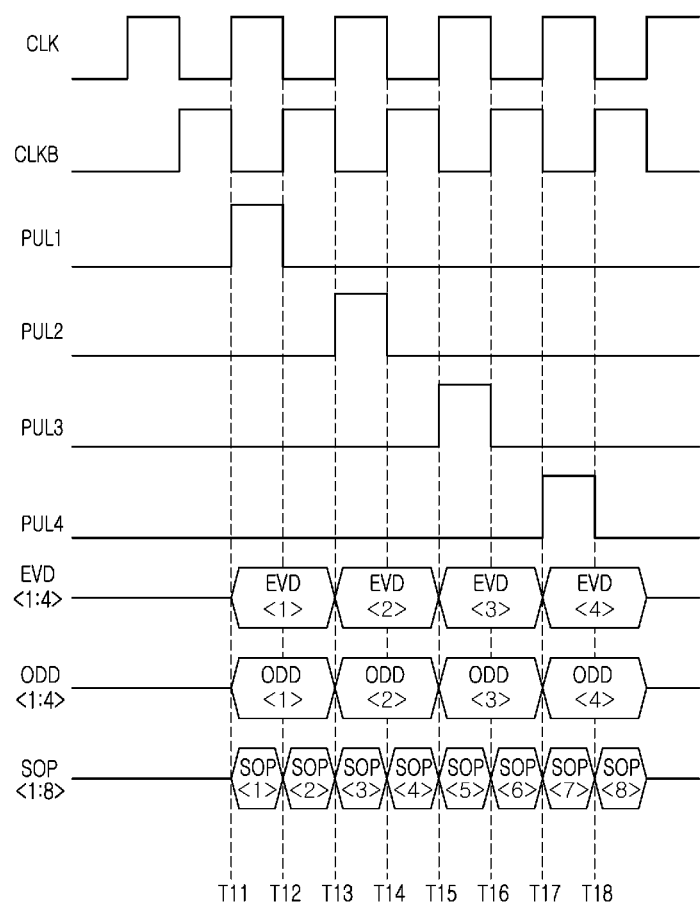
FIG. 6 is a timing diagram illustrating a representation of an example an operation of a serial control code generation unit included in the serialization unit of FIG. 4.

An operation of the serial control code generation unit 236 will be described hereinafter with reference to FIG. 6 in conjunction with an example in which the first to eighth serial control codes SOP<1:8> are generated by serializing the first to eighth low-order transfer data TD3<1:8> in synchronization with the first to fourth pulse signals PUL1, PUL2, PUL3, and PUL4.

At a point of time "T11", the first alignment unit 2361 may generate the first even data EVD<1> by latching the first low-order transfer data TD3<1> in synchronization with the first pulse signal PUL1.

The first drive unit 2362 may generate the first serial control code SOP<1> by buffering the first even data EVD<1> in synchronization with the rising edge of the clock signal CLK.

The second alignment unit 2363 may generate the first odd data ODD<1> by latching the second low-order transfer data TD3<2> in synchronization with the first pulse signal PUL1. The point of time "T11" is the same point of time as the point of time "T1" of FIG. 5.

At a point of time "T12", the second drive unit 2364 may generate the second serial control code SOP<2> by buffering the first odd data ODD<1> in synchronization with the rising edge of the inverted clock signal CLKB. The point of time "T12" is the same point of time as the point of time "T2" of FIG. 5.

At a point of time "T13", the first alignment unit 2361 may generate the second even data EVD<2> by latching the third low-order transfer data TD3<3> in synchronization with the second pulse signal PUL2.

The first drive unit 2362 may generate the third serial control code SOP<3> by buffering the second even data EVD<2> in synchronization with the rising edge of the clock signal CLK.

The second alignment unit 2363 may generate the second odd data ODD<2> by latching the fourth low-order transfer data TD3<4> in synchronization with the second pulse signal PUL2. The point of time "T13" is the same point of time as the point of time "T3" of FIG. 5.

At a point of time "T14", the second drive unit 2364 may generate the fourth serial control code SOP<4> by buffering the second odd data ODD<2> in synchronization with the rising edge of the inverted clock signal CLKB. The point of time "T14" is the same point of time as the point of time "T4" of FIG. 5.

At a point of time "T15", the first alignment unit 2361 may generate the third even data EVD<3> by latching the fifth low-order transfer data TD3<5> in synchronization with the third pulse signal PUL3.

The first drive unit 2362 may generate the fifth serial control code SOP<5> by buffering the third even data EVD<3> in synchronization with the rising edge of the clock signal CLK.

The second alignment unit 2363 may generate the third odd data ODD<3> by latching the sixth low-order transfer data TD3<6> in synchronization with the third pulse signal PUL3. The point of time "T15" is the same point of time as the point of time "T5" of FIG. 5.

At a point of time "T16", the second drive unit 2364 may generate the sixth serial control code SOP<6> by buffering the third odd data ODD<3> in synchronization with the rising edge of the inverted clock signal CLKB. The point of time "T16" is the same point of time as the point of time "T6" of FIG. 5.

At a point of time "T17", the first alignment unit 2361 may generate the fourth even data EVD<4> by latching the seventh low-order transfer data TD3<7> in synchronization with the fourth pulse signal PUL4.

The first drive unit 2362 may generate the seventh serial control code SOP<7> by buffering the fourth even data EVD<4> in synchronization with the rising edge of the clock signal CLK.

The second alignment unit 2363 may generate the fourth odd data ODD<4> by latching the eighth low-order transfer data TD3<8> in synchronization with the fourth pulse signal PUL4. The point of time "T17" is the same point of time as the pint of time "T7" of FIG. 5.

At a point of time "T18", the second drive unit 2364 may generate the eighth serial control code SOP<8> by buffering the fourth odd data ODD<4> in synchronization with the rising edge of the inverted clock signal CLKB. The point of time "T18" is the same point of time as the point of time "T8" of FIG. 5.

As described above, the serial control code generation unit 236 may generate the first to eighth serial control codes SOP<1:8> by serializing the first to eighth low-order transfer data TD3<1:8> in synchronization with the first to fourth pulse signals PUL1, PUL2, PUL3, and PUL4.

An operation of the semiconductor system according to an embodiment of the present disclosure will be described hereinafter with reference to FIGS. 1 to 6 in conjunction with an example in which the first to eighth control codes OP<1:8> are generated from the command/address signals CA<1:8> in the test mode and the first to eighth control codes OP<1:8> are serialized and outputted as the first output data DQ<1>.

The controller 10 may output the first to eighth command/address signals CA<1:8> having the first combination to put the semiconductor device 20 in the test mode.

The command decoder 211 of the path control unit 21 may receive the first to eighth command/address signals CA<1:8> having the first combination to generate the first command MRW. The command decoder 211 may generate the first to eighth control codes OP<1:8> from the first to eighth command/address signals CA<1:8>. The command decoder 211 may be configured to generate the first to eighth control codes OP<1:8> from the first to eighth command/address signals CA<1:8> that are inputted after the first to eighth command/address signals CA<1:8> having the first combination are inputted thereto.

The test mode signal generation unit 212 may receive the first command MRW to generate the test mode signal TM that is enabled.

The register unit 213 may store the first to eighth control codes OP<1:8> therein and may output the stored first to eighth control codes OP<1:8> as the first to eighth internal control codes IOP<1:8>.

The first selection transfer unit 22 may receive the test mode signal TM to output the first to eighth internal control codes IOP<1:8> as the first to eighth high-order parallel control codes POP1<1:8>.

At this time, the controller 10 may output the first to eighth command/address signals CA<1:8> having the second combination.

The command decoder 211 of the path control unit 21 may receive the first to eighth command/address signals CA<1:8> having the second combination to generate the second command MRR.

The third selection transfer unit 231 of the path conversion unit 23 may receive the second command MRR to output the first to eighth high-order parallel control codes POP1<1:8> as the first to eighth high-order transfer data TD1<1:8>.

The signal transfer unit 232 may receive the control signal CON disabled to a logic high level in the test mode to output the first to eighth high-order transfer data TD1<1:8> as the first to eighth low-order transfer data TD3<1:8>.

The serialization unit 233 may generate the first to eighth serial control codes SOP<1:8> by serializing the first to eighth low-order transfer data TD3<1:8>.

The second selection transfer unit 24 may receive the test mode signal TM to output the first to eighth serial control codes SOP<1:8> as the first internal data IDQ<1> among the first to eighth internal data IDQ<1:8>.

The pad section 25 may receive the first internal data IDQ<1> and may output the first internal data IDQ<1> as the first output data DQ<1>.

The controller 10 may receive the first output data DQ<1> including the internal information of the semiconductor system 20.

The semiconductor system having the aforementioned configurations may serialize a plurality of control codes including internal information of the semiconductor device and may be generated in parallel and may output the control codes through one pad. As a result, a controller of the semiconductor system may recognize the internal information of the semiconductor device, and test equipment may receive the internal information of the semiconductor device through one pad to reduce a testing time.

Figure 7:
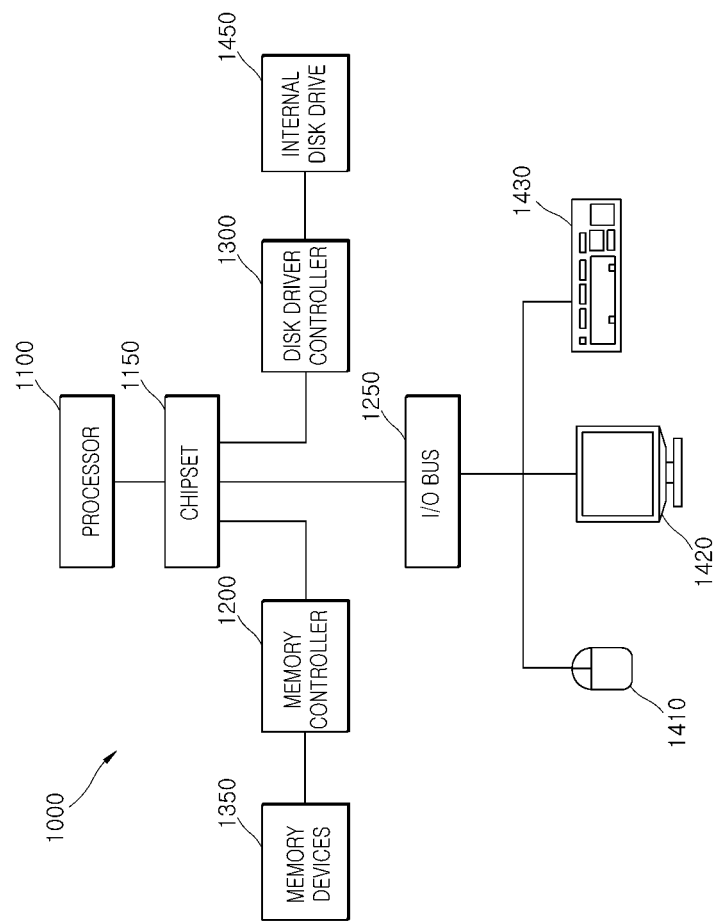
FIG. 7 illustrates a block diagram of an example of a representation of a system employing a semiconductor system and/or semiconductor device in accordance with the various embodiments discussed above with relation to FIGS. 1-6.

The semiconductor system and/or semiconductor devices discussed above (see FIGS. 1-6) are particular useful in the design of memory devices, processors, and computer systems. For example, referring to FIG. 7, a block diagram of a system employing a semiconductor system and/or semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor system and/or semiconductor device as discussed above with reference to FIGS. 1-6. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor system and/or semiconductor device as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 7 is merely one example of a system 1000 employing a semiconductor system and/or semiconductor device as discussed above with relation to FIGS. 1-6. In alternate embodiments, such as, for example but not limited to, cellular phones or digital cameras, the components may differ from the embodiments illustrated in FIG. 7.

What is claimed is:

1. A semiconductor device comprising:
a first selection transfer unit suitable for outputting a plurality of internal control codes as a plurality of high-order parallel control codes if a test mode signal is enabled and suitable for outputting the plurality of internal control codes as a plurality of low-order parallel control codes if the test mode signal is disabled;
a path conversion unit suitable for generating a serial control code by serializing the plurality of high-order parallel control codes while the semiconductor device is in a test mode and suitable for outputting a plurality of global data as a plurality of internal data while the semiconductor device is in a normal mode;
a second selection transfer unit suitable for outputting the serial control code as first internal data if the test mode signal is enabled and suitable for outputting the plurality of low-order parallel control codes as the plurality of internal data if the test mode signal is disabled;
a pad section including a plurality of pads, the pad section suitable for outputting through the plurality of pads the plurality of internal data as a plurality of output data; and
a path control unit suitable for generating the test mode signal enabled if a combination of command/address signals is a first combination, suitable for storing a plurality of control codes generated from the command/address signals, and suitable for outputting the stored control codes as the plurality of internal control codes.

2. The device of claim 1, wherein the first internal data is generated by sequentially serializing the plurality of internal control codes while the semiconductor device is in the test mode.

3. The device of claim 1, wherein the plurality of internal data is generated by outputting the plurality of internal control codes while the semiconductor device is in the test mode.

4. The device of claim 1, wherein the first internal data is at least one of the plurality of internal data.

5. The device of claim 1, wherein the path control unit includes:
a command decoder suitable for generating a first command enabled if the command/address signals have the first combination, suitable for generating the plurality of control codes from the command/address signals, and suitable for generating a second command enabled if the command/address signals have a second combination;
a test mode signal generation unit suitable for generating the test mode signal enabled in response to the first command; and
a register unit suitable for storing the plurality of control codes and suitable for outputting the stored control codes as the plurality of internal control codes.

6. The device of claim 1, wherein the path conversion unit includes:
a third selection transfer unit suitable for receiving a second command to output the plurality of high-order parallel control codes as a plurality of high-order transfer data or to output the plurality of high-order transfer data as a plurality of mid-order transfer data;
a signal transfer unit suitable for receiving a control signal to output the plurality of high-order transfer data as a plurality of low-order transfer data or to output the plurality of global data as the plurality of high-order transfer data; and
a serialization unit suitable for generating the serial control code by serializing the plurality of low-order transfer data in synchronization with a clock signal.

7. The device of claim 6, wherein the signal transfer unit includes:
a first transfer unit suitable for outputting the plurality of global data as the plurality of high-order transfer data in response to the control signal; and
a second transfer unit suitable for outputting the plurality of high-order transfer data as the plurality of low-order transfer data in response to the control signal.

8. The device of claim 6, further comprising:
a parallelization unit suitable for outputting the plurality of mid-order transfer data as the plurality of internal data.

9. The device of claim 6, wherein the serialization unit includes:
a clock dividing unit suitable for dividing a frequency of the clock signal to generate first and second pulse signals including pulses that are sequentially generated; and
a serial control code generation unit suitable for serializing the plurality of low-order transfer data in synchronization with the first and second pulse signals to generate the serial control code.

10. The device of claim 9, wherein the clock dividing unit includes:
a first frequency dividing unit suitable for dividing frequencies of the clock signal and an inverted clock signal to generate a rising clock signal and a falling clock signal;
a second frequency dividing unit suitable for dividing frequencies of the rising clock signals and an inverted rising clock signal to generate first and second dividing clock signals; and
a pulse generation unit suitable for generating the first pulse signal including pulses that are generated in synchronization with a rising edge of the first dividing clock signal and suitable for generating the second pulse signal including pulses that are generated in synchronization with a rising edge of the second dividing clock signal.

11. The device of claim 9, wherein the serial control code generation unit includes:
a first alignment unit suitable for generating first and second even data by serializing first and third low-order transfer data among the plurality of low-order transfer data in synchronization with the first and second pulse signals;
a first drive unit suitable for receiving the first and second even data in synchronization with the clock signal to generate first and third serial control codes among the serial control codes;
a second alignment unit suitable for generating first and second odd data by serializing second and fourth low-order transfer data among the plurality of low-order transfer data in synchronization with the first and second pulse signals; and
a second drive unit suitable for receiving the first and second odd data in synchronization with the inverted clock signal to generate second and fourth serial control codes among the serial control codes.

* * * * *